United States Patent [19]

Nakata

[11] 4,004,166
[45] Jan. 18, 1977

[54] METHOD FOR STABILIZING THE VIBRATION FREQUENCY OF A TUNING FORK-TYPE QUARTZ CRYSTAL OSCILLATOR

[75] Inventor: Hozumi Nakata, Iruma, Japan
[73] Assignee: Nihon Dempa Kogyo Co., Ltd., Tokyo, Japan
[22] Filed: Mar. 12, 1975
[21] Appl. No.: 557,523
[52] U.S. Cl. .............................. 310/8.2; 310/9.4; 310/9.6; 310/25; 29/25.35
[51] Int. Cl.² ........................................ H01L 41/08
[58] Field of Search ............ 310/8.2, 8.5, 8.6, 9.1, 310/9.4, 9.6, 25, 8.1; 58/23 TF; 84/457; 29/592, 25.35

[56] References Cited
UNITED STATES PATENTS

| | | | |
|---|---|---|---|
| 3,354,413 | 11/1967 | Ko | 310/8.6 X |
| 3,462,939 | 8/1969 | Tanaka et al. | 58/23 TF |
| 3,636,810 | 1/1972 | Reefman | 84/457 |
| 3,683,213 | 8/1972 | Staudte | 310/9.6 |
| 3,697,766 | 10/1972 | Ganter | 310/8.2 |
| 3,697,789 | 10/1972 | Kato et al. | 310/8.2 X |
| 3,759,133 | 9/1973 | Budych | 58/23 TF |
| 3,766,616 | 10/1973 | Staudte | 310/8.2 X |

Primary Examiner—Mark O. Budd
Attorney, Agent, or Firm—Flynn & Frishauf

[57] ABSTRACT

A method for stabilizing the vibration frequency of an oscillator which contains a tuning fork-type quartz crystal element comprising a pair of arms each having a given size and a common connecting section connecting the mutually facing ends of the paired arms. The method comprises bonding the common connecting section of the quartz crystal element directly to a base member supporting the same by an appropriate adhesive agent, sensing the amount of vibration energy leaking from the crystal element into the base member while causing the paired crystal arms to be mechanically vibrated in the opposite directions, and minimizing the leaking vibration energy by repeatedly adjusting each size of the paired crystal arms, thereby enabling the subject quartz crystal oscillator not only to minimize the amount of vibration energy leaking to the outside therefrom but also present excellent resistance to external mechanical vibrations and shocks, and consequently maintaining the vibration frequency of the crystal oscillator at the highest possible precision and stability for a long period of time.

3 Claims, 11 Drawing Figures

METHOD FOR STABILIZING THE VIBRATION FREQUENCY OF A TUNING FORK-TYPE QUARTZ CRYSTAL OSCILLATOR

BACKGROUND OF THE INVENTION

This invention relates to a method for stabilizing the vibration frequency of a tuning fork-type quartz crystal oscillator particularly designed to vibrate within a low frequency range from about 1 KHz to about 1 MHz. A tuning fork-type quartz crystal oscillator whose crystal element vibrates within such a low frequency range may be exemplified by one adapted to vibrate generally at 32.768 KHz for a quartz crystal electric watch.

Such prior art tuning fork-type quartz crystal oscillators include a type constructed as shown in FIG. 1. This type is provided with a base member 11 on which a pair of rod electrodes 12a and 12b concurrently serving as external electrodes are mounted at a predetermined interval and extend upward and downward of the base member 11. A substantially U-shaped tuning fork-type quartz crystal element 13 of the undermentioned configuration is disposed at a predetermined position above the base member 11 between the paired rod electrodes 12a and 12b.

The quartz crystal element 13 comprises a pair of arms 13a and 13b formed with substantially the same dimensions, i.e., cross section and length, and a common connecting section 13c connecting the mutually facing ends of the paired crystal arms 13a and 13b.

Under this arrangement, the quartz crystal element 13 is fitted by a pair of flexible lead wires 14a and 14b made of, e.g., phosphor bronze to the paired rod electrodes 12a and 12b, by soldering a pair of nodal points 15a and 15b which are preset on a pair of crystal electrodes previously evaporated on the surface of the quartz crystal element 13 to the corresponding rod electrodes 12a and 12b through the respective lead wires 14a and 14b. Thus, after fixing the crystal element 13 to the base member 11 as described above, an electroconductive metal cover 16 having a substantially U-shaped cross section and acting as an electric shield is hermetically sealed on the base member 11 as shown by a dotted line in FIG. 1. The paired flexible lead wires 14a and 14b, the paired rod electrodes 12a and 12b, the base member 11 and the metal cover 16 collectively function as a holding mechanism 17 for supporting the crystal element 13.

However, with the prior art tuning fork-type quartz crystal oscillator constructed as shown in FIG. 1, the quartz crystal element 13 is fitted only to the paired rod electrodes 12a and 12b by flexible lead wires 14a and 14b. Consequently, said prior art crystal oscillator not only exhibits low resistance to external mechanical vibrations and shocks but also tends to cause the supporting position of the crystal element 13 relative to the holding mechanism 17 to be deviated during a long use, and in consequence has the disadvantage that is unadapted for, e.g., an electric watch the vibration frequency of whose crystal oscillator requires to be kept at the highest possible precision and stability for a long period of time.

Accordingly, there has recently been proposed a tuning fork-type quartz crystal oscillator as shown in FIG. 2 which is intended to improve the crystal oscillator of FIG. 1.

The crystal oscillator of FIG. 2 is almost equivalent to that of FIG. 1, excepting that a holding mechanism 171 for supporting the quartz crystal element 13 is provided with a fine supporting rod 18 made of appropriate elastic material such as phosphor bronze or gold and disposed between substantially the center of the bottom of the aforesaid common crystal connecting section 13c and that upper surface portion of the base member 11 which faces the supporting rod 18, in addition to the same construction as the holding mechanism 17 including the paired flexible lead wires 14a and 14b, base member 11 and the cover 16. Therefore, parts of FIG. 2 corresponding to those of FIG. 1 are designated by the same symbols and the description thereof is omitted.

The crystal oscillator constructed as shown in FIG. 2 can allow the quartz crystal element 13 to be fixed to its holding mechanism 171 in a more stable state than in the crystal oscillator of FIG. 1 due to addition of the aforesaid supporting rod 18 to the holding mechanism 17 of FIG. 1, enabling the vibration frequency of the crystal oscillator to be kept at a considerably high stability for a long period of time.

However, the crystal oscillator of FIG. 2 still has the disadvantages that:

a. the supporting rod 18 is fitted only to substantially the center of the bottom of the common connecting section 13c of the paired crystal arms 13a and 13b by point contact, and in consequence not only prevents the crystal element 13 attached to the base member 11 from presenting sufficient resistance to external mechanical vibrations and shocks, but also requires high degree of technique and sense in the process of fitting the supporting rod 18 to the crystal element 13;

b. the supporting rod 18 also tends to remain deformed during long use, leading to deviations in the vibration frequency of the crystal oscillator; and c. since a tuning fork-type quartz crystal oscillator is ordinarily designed mechanically to vibrate in the so-called tuning fork-type mode in which its paired crystal arms oscillate the preset number of times in the opposite directions to almost the same degree (see FIGS. 3 and 5), part of the vibration energy of the paired crystal arms is transmitted to the common connecting section thereof, causing part of the aforesaid transmitted vibration energy to leak to the outside from the crystal oscillator, with the failure to prevent any slight deviation of the vibration frequency of the oscillator when it is incorporated in such a desired instrument as an electric crystal watch, even if the vibration frequency of the oscillator is previously defined with any high precision.

The reason for the above-mentioned drawbacks accompanying the crystal oscillator constructed as shown in FIG. 2 originates with the fact that a shearing force A-A' acting in such opposite directions as to increase the width W of the common crystal connecting section 13c starting with a connecting point 19 of the supporting rod 18 and the bottom of common crystal connecting section13c, a shearing force B-B' acting in the same direction decreasing the length of the supporting rod 18, and a rotational moment M-M' acting in the direction causing the common crystal connecting sections to rotate in the direction of the supporting rod 18 all these three forces are applied to the bottom of the common crystal connecting section 13c, when the paired crystal arms 13a and 13b vibrate in the above-mentioned manner. The aforesaid shearing forces A-A' and B-B' and rotational moment M-M' also adversely affect the base member 11, rendering the vibration frequency of the crystal oscillator unstable.

Accordingly, the crystal oscillator constructed as shown in FIG. 2 is also unadapted to be applied to such an instrument as an electric crystal watch whose crystal oscillator should have its vibration frequency maintained at the highest possible precision and stability for a long period of time. It is, therefore, the object of this invention to provide a tuning fork-type quartz crystal oscillator capable of keeping is vibration frequency at the highest possible precision and stability for a long period of time under any environment.

SUMMARY OF THE INVENTION

A method for stabilizing the vibration frequency of a tuning fork-type quartz crystal oscillator according to this invention is characterized by comprising the steps of bonding a common connecting section of a tuning fork-type quartz crystal element having a substantially U-shape directly to a base member supporting the same by an appropriate adhesive agent, sensing the amount of vibration energy leaking from the quartz crystal element into the base member while causing a pair of arms of the crystal element to be mechanically vibrated, and minimizing said leaking vibration energy by repeatedly adjusting each side of the paired crystal arms.

A tuning fork-type quartz crystal oscillator made up by the aforesaid process not only enables the amount of vibration energy leaking to the outside therefrom to be minimized but also exhibits prominent resistance to external mechanical vibrations and shocks, and in consequence maintains the vibration frequency of the crystal oscillator at the highest possible precision and stability for a long period of time.

Additionally, the crystal oscillator whose quartz crystal element is fitted directly to the base member by the adhesive agent attains miniaturization particularly suitable for use with such an instrument of small size as an electric crystal watch.

PREFERRED EMBODIMENT OF THE INVENTION

Prior to the description of the preferred embodiment of this invention, it will be noted that the vibration frequency of a tuning fork-type quartz crystal oscillator and the stability thereof during long use are mainly determined by the inherent vibration frequency of a tuning fork-type quartz crystal element which is incorporated in the subject crystal oscillator, the inherent vibration frequency of a holding mechanism including the aforesaid base member and cover for supporting the quartz crystal element, and the aforesaid shearing forces A-A' and B-B' and rotational moment M-M' which act on the connecting point between the quartz crystal element and the holding mechanism fitted together.

Accordingly, the precision and stability of the vibration frequency of a subject tuning fork-type quartz crystal oscillator during a long period of use is determined by the magnitude of deviations of the above-mentioned various factors when the crystal oscillator is incorporated in such a desired instrument as an electric crystal watch.

The preferred embodiment of this invention will now be described by reference to FIGS. 4A–4B to 8A–8B.

Figures 4A, 4B:
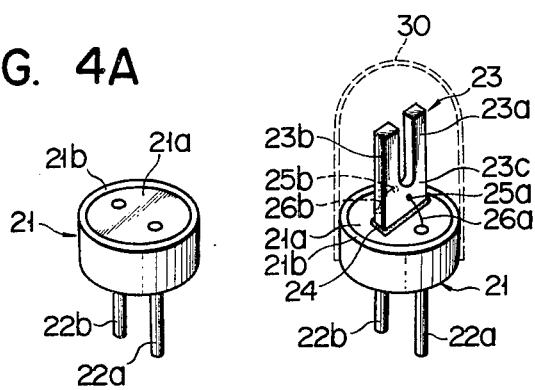
FIGS. 4A and 4B are schematic perspective views jointly showing a tuning fork-type quartz crystal oscillator made up in accordance with the method of this invention.

FIGS. 4A and 4B are schematic perspective views jointly showing a tuning fork-type quartz crystal oscillator made up according to the method of this invention. To build a tuning fork-type quartz crystal oscillator in accordance with the process of this invention, a base member 21 is first provided which comprises a disk 21a made of such electric insulating material as glass and having a diameter of about 2 to 4 mm and a thickness of about 1 to 2 mm, and an electroconductive metal layer 21b coated on the peripheral wall of the glass disk 21a with a thickness of about 0.1 to 0.2 mm. Embedded in the glass disk 21a of the base member 21 are a pair of external electrodes 22a and 22b at a prescribed interval such that each embedded end of the paired external electrodes 22a and 22b is exposed on the upper surface of the glass disk 21a. There is next provided a tuning fork-type quartz crystal element 23 having a substantially U-shape which comprises a pair of arms 23a and 23b each formed with a given size, i.e., cross section and length, and a common connecting section 23c connecting the mutually facing ends of the paired crystal arms 23a and 23b.

Thus, the first process of forming a tuning fork-type quartz crystal oscillator according to the method of this invention comprises fixing the bottom of the common connecting section 23c of the crystal element 23 directly to the base member 21 by such an appropriate electroconductive or electric insulating adhesive agent 24 as commercially known as DU PONT-5504A amd S-DINE.

Figure 5:
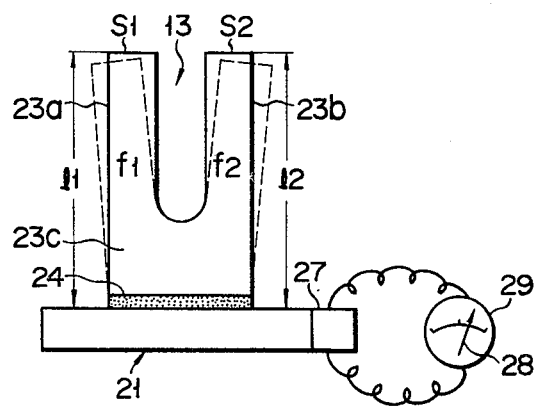
FIG. 5 is an enlarged front view illustrating the vibrational behavior of a quartz crystal element shown in FIG. 4B and a process for adjusting each size of a pair of arms of the crystal element.

Under this arrangement, a pair of nodal points 25a and 25b which are preset on a pair of crystal electrodes previously evaporated on the surfaces of the crystal element 23 are soldered to the respective embedded ends of the paired external electrodes 22a and 22b by a pair of flexible lead wires 26a and 26b made of, e.g., phosphor bronze. Then, a sensor 27 is attached to the base member 21 as shown in FIG. 5.

An indicator 29 such as conventional voltmeter having a pointer 28 deflectable over a prescribed range is connected to the output terminals of the sensor 27. Under this arrangement, the second process of constructing a tuning fork-type quartz crystal oscillator comprises sensing by the indicator 29 the amount of vibration energy leaking to the sensor 27 from the crystal element 23 through the adhesive agent 24 and the base member 21, while causing the paired crystal arms 23a and 23b to be vibrated in the opposite directions as shown by dotted lines in FIG. 5. Now let the effective vibration frequency of one of the paired crystal arms, for example, 23a be designated as $f_1$ and that of the other crystal arm 23b as $f_2$. Then, this inventor has experimentally found that the larger the difference between the effective vibration frequencies of the paired crystal arms 23a and 23b or the difference between the sizes thereof, the higher the level of the aforesaid leaking vibration energy detected by the indicator 29 through the sensor 27 or the amount of deflection of the pointer 28 on the indicator 29. The level of said leaking vibration energy is also more elevated when the acoustic impedance of the crystal element 23 is almost equal to that of the adhesive agent 24 than when the former differs from the latter. Hence, it is well known to those skilled in the art that the effective vibration frequencies $f_1$ and $f_2$ of the respective crystal arms 23a and 23b should be determined by the following equation:

$$\left. \begin{array}{l} f_1 = k \times \dfrac{S_1}{l_1^2} \\ f_2 = k \times \dfrac{S_2}{l_2^2} \end{array} \right\} \quad (1)$$

where
  $k$: a constant,
  $l_1, l_2$: the respective lengths of the paired crystal arms, and
  $S_1, S_2$: the respective widths thereof.

In view of the above-mentioned facts, the third or final process of making up a tuning fork-type quartz crystal oscillator according to the method of this invention comprises repeatedly adjusting each size of the paired crystal arms 23a and 23b until the deflecting angle of the pointer 28 on the indicator 29 is nearly brought to zero according to the amount of deflection of the pointer 28. When said deflecting angle substantially reaches zero, the sensor 27 is removed from the base member 21 and the electroconductive metal cover 30 is finally hermetically sealed on the base member 21.

As used herein, the term "adjustment" of each size of the paired crystal arms means not only adjusting the respective sizes of the paired crystal arms but also adding any other material to one or both of the crystal arms and cutting off part of the added material.

Figure 6:
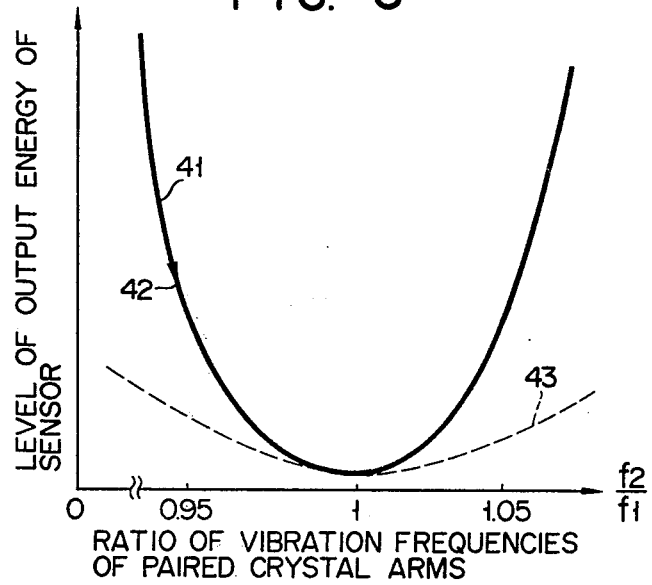
FIG. 6 is a curve diagram illustrating the relationship between the ratio of vibration frequencies of a pair of arms of each quartz crystal element shown in FIGS. 4B and 2 and the output level of a sensor when each size of the paired arms of the respective crystal elements is adjusted over a wide range.

A curve 41 shown by a solid line in FIG. 6 illustrates the relationship between the ratio $f_2/f_1$ of the effective vibration frequencies of the paired crystal arms 23a and 23b and that output energy level of the sensor 27 which is indicated by the deflecting amount of the pointer 28 on the indicator 29 where the paired crystal arms 23a and 23b are so previously formed to have their sizes that said ratio $f_2/f_1$ is smaller than 1 and then the respective sizes of the paired crystal arms are so adjusted that said ratio $f_2/f_1$ is successively reduced as shown by an arrow 42 in FIG. 6 until it is arrived at about 1 and thereafter said ratio $f_2/f_1$ is successively increased to have a value larger than 1. On the contrary, a curve 43 shown by a dotted line in FIG. 6 indicates the result where the same experiment (see FIG. 3) as in said curve 41 utilizing the crystal oscillator constructed as shown in FIG. 2 is conducted.

As seen from FIG. 6, said curve 41 is sloped sharper than said curve 43. Accordingly, a tuning fork-type quartz crystal oscillator constructed as shown in FIGS. 4A and 4B according to the method of this invention enables the adjustment of the individual sizes of the paired crystal arms having a certain difference between said sizes of the paired crystal arms or the effective vibration frequencies thereof to render easier than as in a tuning fork-type quartz crystal oscillator constructed as shown in FIG. 2 even if it is made up by applying the aforesaid three processes of this invention. The reason is so considered that the bottom of the common connecting section 23c of the crystal element 23 included in the crystal oscillator of FIG. 4B is fitted by the adhesive agent 24 to the base member 21 with a larger area than in the supporting rod 18 used in the crystal oscillator of FIG. 2 and consequently the crystal oscillator of FIG. 4B causes a larger amount of vibration energy than in the crystal oscillator of FIG. 2 to leak to the base member, when the paired crystal arms have their sizes differed from each other in a certain level.

Figure 1:
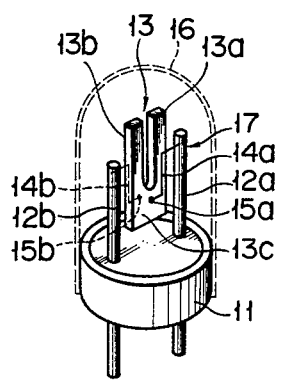
FIGS. 1 and 2 are schematic perspective views of different prior art tuning fork-type quartz crystal oscillators.
Figure 2:
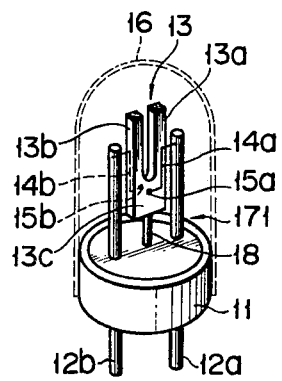
Figure 3:
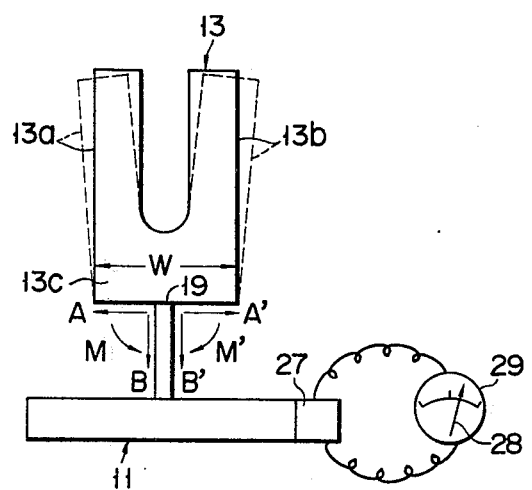
FIG. 3 is an enlarged front view illustrating the vibrational behavior of a quartz crystal element shown in FIG. 2.

The crystal oscillator of FIG. 4B employs the appropriate adhesive agent 24 in place of the supporting rod 18 used in the crystal oscillator of FIG. 2, and consequently further has the advantage that its height is reduced than in the crystal oscillator of FIG. 2, attaining the greatest possible miniaturization particularly suitable for such an instrument as an electric crystal watch.

Table 1 below gives the respective average values of the effective or crystal impedance CI and the quality Q of the crystal oscillator as measured where it is formed by application of the aforesaid three processes according to the method of this invention as well as where said formation is carried out without applying said method, and also the average values of deviation Δf of each vibration frequency $f$ of the crystal oscillator provided according to the method of this invention and the prior art crystal oscillator constructed as shown in FIG. 2 as measured, where both crystal oscillators are incorporated in such an instrument as an electric watch.

Table 1

|    | Prior art crystal oscillator | Crystal oscillator of this invention |
|----|------------------------------|--------------------------------------|
| CI | 180 KΩ                       | 17 KΩ                                |
| Q  | $14 \times 10^3$             | $15 \times 10^4$                     |
| Δf | $8 \times 10^2$ ppm          | 0.04 ppm                             |

Referring to Table 1 above, a tuning fork-type quartz crystal oscillator made up according to the method of this invention shows that its crystal impedance CI and quality Q are more improved than those as in the prior art tuning fork-type crystal oscillator. The reason is based on the fact that the crystal oscillator of this invention not only enables its vibration frequency to render more stable than in the prior art crystal oscillator but also allows the amount of its vibration frequency leaking to the outside from the oscillator to be minimized.

Table 2 below indicates the average values of deviation Δf' of the vibration frequency of the crystal oscillator under gravity of about 5000 G as measured where it is formed by application of the method of this invention as well as where said formation is carried out without applying said method.

Table 2

| | Prior art crystal oscillator | Crystal oscillator of this invention |
|---|---|---|
| Δf' | 10 ppm | 0.4 ppm |

Referring to Table 2, a tuning fork-type quartz crystal oscillator provided according to the method of this invention indicates a more improved resistance to external mechanical vibrations and shocks than the prior art tuning fork-type quartz crystal oscillator.

Figures 7A, 7B:
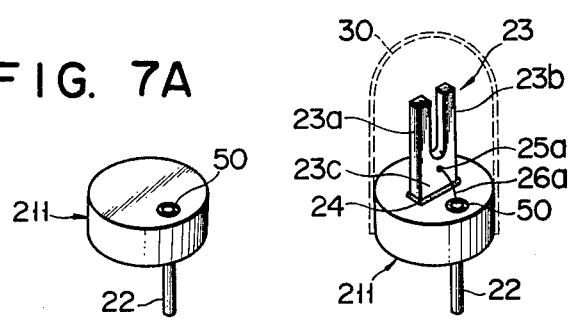
FIGS. 7A–7B and 8A–8B respectively are schematic perspective views of different tuning fork-type quartz crystal oscillators made up according to the method of this invention.

FIGS. 7A and 7B areschematic perspective views jointly showing another tuning fork-type quartz crystal oscillator built according to the method of this invention. The oscillator is substantially the same as that of FIGS. 4A and 4B, excepting that a base member 211 made of electroconductive material or comprising an electric insulation central glass disk similar to the glass disk 21a of FIGS. 4A and 4B, and an electroconductive metal layer coated on all the surface of the central glass disk is replaced with the base member 21 of FIGS. 4A and 4B; the base member 211 concurrently serves as one of the paired external electrodes 22a and 22b; and part of the unremoved external electrode 22 is embedded in the base member 211 through electric insulating material 50, and is consequently less expensive than that of FIGS. 4A 4B.

Figures 8A, 8B:
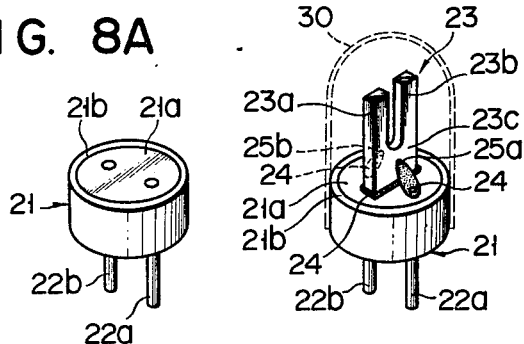

FIGS. 8A and 8B are schematic perspective views jointly illustrating a still another tuning fork-type quartz crystal oscillator made up according to the method of this invention.

The crystal oscillator is almost the same as that of FIGS. 4A and 4B, excepting that the aforesaid adhesive agent 24 of electroconductive type is replaced with the paired flexible lead wires 26a and 26b, preventing its vibration frequency from being adversely affected by the free vibration frequency of the paired flexible lead wires 26a and 26b.

What is claimed is:

1. A method for stabilizing the vibration frequency of an oscillator which contains a tuning fork-type quartz crystal element comprising a pair of arms having mutually facing ends, each arm having a given size, and a common connecting section connecting the mutually facing ends of the paired arms, the method comprising:

bonding only substantially the whole bottom surface of the common connecting section of said tuning fork-type quartz crystal element directly to a base member supporting the same by an adhesive agent;

mechanically vibrating the paired quartz crystal arms and sensing the amount of vibration energy leaking from the common connecting section of said quartz crystal element into the base member while the paired quartz crystal arms are mechanically vibrating; and minimizing said leaking vibration energy by repeatedly adjusting the sizes of the paired quartz crystal arms.

2. A method claimed in claim 1 wherein a pair of crystal electrodes are provided on the periphery of said quartz crystal element and a pair of external electrodes are attached to the base member, comprising connecting the paired crystal electrodes of said quartz crystal element by an electroconductive adhesive agent to the paired external electrodes.

3. A method claimed in claim 2 comprising fabricating at least that surface portion of the base member on which said quartz crystal element is disposed of electroconductive material, and connecting said electroconductive surface portion of the base member as one of the paired external electrodes.

* * * * *